(12) United States Patent
Tai et al.

(10) Patent No.: US 7,330,059 B2
(45) Date of Patent: Feb. 12, 2008

(54) IN-LOOP DUTY CORRECTOR DELAY-LOCKED LOOP FOR MULTIPHASE CLOCK GENERATION

(75) Inventors: Gwo-Chung Tai, San Jose, CA (US); Kin Hui, San Jose, CA (US)

(73) Assignee: Micrel, Incorporated, San Jose, CA (US)

( * ) Notice: Subject to any disclaimer, the term of this patent is extended or adjusted under 35 U.S.C. 154(b) by 66 days.

(21) Appl. No.: 11/212,003

(22) Filed: Aug. 24, 2005

(65) Prior Publication Data

US 2007/0046345 A1 Mar. 1, 2007

(51) Int. Cl.
*H03L 7/06* (2006.01)

(52) U.S. Cl. .................. 327/158; 327/149; 327/175

(58) Field of Classification Search ............... None
See application file for complete search history.

(56) References Cited

U.S. PATENT DOCUMENTS

| | | |
|---|---|---|
| 5,614,855 A | 3/1997 | Lee et al. |
| 6,897,693 B2 | 5/2005 | Kim |
| 6,943,604 B2 * | 9/2005 | Minzoni .................. 327/175 |
| 2004/0210790 A1* | 10/2004 | Moon et al. ............ 713/500 |

OTHER PUBLICATIONS

Yang et al.: "A Wide-Range Multiphase Delay-Locked Loop Using Mixed-Mode VCDLs", IEICE Trans. Electron., vol. E88-C, No. 6, Jun. 2005, pp. 1248-1252.
Kuo et al.: "A Linear MOS Transconductor Using Source Degeneration And Adaptive Biasing", IEEE Transactions On Circuits And Systems-II, Analog And Digital Signal Processing, vol. 48, No. 10, Oct. 2001, pp. 937-943.
Jung et al.: "A Dual-Loop Delay-Locked Loop Using Multiple Voltage-Controlled Delay Lines", IEEE Journal Of Solid-State Circuits, vol. 36, No. 5, May 2001, pp. 784-791.

* cited by examiner

*Primary Examiner*—Cassandra Cox
(74) *Attorney, Agent, or Firm*—Bever, Hoffman & Harms, LLP; Jeanette S. Harms

(57) ABSTRACT

A delay-locked loop (DLL) employs an in-loop duty cycle corrector (DCC) to provide accurate multiphase clock generation with 50% duty cycle. Each delay cell can advantageously provide both delay and duty cycle correction functionality. In one embodiment, delay correction can precede duty cycle correction. The bandwidths of the DCC and the DLL can differ by a factor of a decade to achieve fast and stable operation.

24 Claims, 9 Drawing Sheets

IN-LOOP DUTY CORRECTOR DELAY-LOCKED LOOP FOR MULTIPHASE CLOCK GENERATION

BACKGROUND OF THE INVENTION

1. Field of the Invention

The present invention relates to a semiconductor integrated circuit and in particular to generating individually accurate multiphase clocks with 50% duty cycle using a delay-locked loop (DLL).

2. Description of Related Art

To provide the functionalities required by many applications, integrated circuits (ICs) must run at ever increasing speeds. These speeds in turn require many components in an IC to be carefully timed such that they can be turned on or off precisely at different (or same) instants of time. Exemplary components could include, for example, a microprocessor for a computer, memory devices (e.g. dynamic random access memory, DRAM), and a receiver for a wireless communication device. To provide this essential timing, a delay-locked loop (DLL) can be used to generate a plurality of internal clocks that are substantially synchronized with an external clock. The better the quality of those internal clocks, i.e. the better they are synchronized, the higher the performance of the system.

FIG. 1 illustrates a conventional DLL 100 that can receive an external clock CLK and generate a plurality of internal clocks that are substantially synchronized with external clock CLK. In this embodiment, DLL 100 includes eight serially-connected delay cells 110(1)-110(8), wherein each delay cell includes a delay circuit 101 and a corresponding delay adjustment circuit 104. For example, delay cell 110(1) includes delay circuit 101(1) and delay adjustment circuit 104(1). The other delay cells in DLL 100, i.e. delay cells 110(2)-110(8), can be formed using similar components. By providing the appropriate delays to the external clock CLK, delay cells 110(1)-110(8) can generate clocks CK1-CK8, respectively, each clock having a particular phase.

For example, FIG. 2 illustrates a timing chart 200 that could be associated with DLL 100, assuming that DLL 100 could generate perfect multiphase clocks. In this embodiment, clock CK1 has a rising edge ("1") at the end of time t1 and a falling edge ("1'") at the end of time t5. Clock CK2 is slightly delayed because of the propagation time of CK1 through delay circuit 101(2). Therefore, clock CK2 has a rising edge ("2") at the end of time t2 and a falling edge ("2'") at the end of time t6. Clocks CK3-CK8 can be generated in a similar manner using delay circuits 101(3)-101(8), respectively. Because delay circuits 101(1)-101(8) are assumed to be identical, clocks CK1-CK8 have equally spacing and identical amplitude.

FIG. 3 illustrates an exemplary phase distribution chart 300 that corresponds with timing chart 200. In phase distribution chart 300, the rising and falling edges of each clock can be generically expressed as vectors N and N', respectively, which can then be depicted in a circle having 360° (which essentially represents one time period $T_{period}$). Thus, in the case of 8 clocks, each clock would optimally be 45° from an adjacent clock. Notably, N and N' are ideally in opposite direction and of equal magnitude. Thus, for example, the rising and falling edges of CK8 (i.e. "8" and "8'", respectively) are in opposite direction and of equal magnitude. Hence, the summation of any vector N and N' is zero.

Referring to both timing chart 200 and phase distribution chart 300, a rising edge of clock CK1 ("1") occurs simultaneously with the falling edge of clock CK5 ("5'"). Similarly, a falling edge of clock CK1 ("1'") occurs simultaneously with the rising edge of clock CK5 ("5"). Thus, because one signal is rising at the same time the other signal is falling, clocks CK1 and CK5 are said to be 180° out of phase with respect to each other.

When DLL 200 is in an ideal locking condition, the generated clocks, e.g. CK1-CK8, are distributed uniformly in one period of a clock cycle ($T_{period}$). Thus, the fundamental constraint on DLL 200 is that the total delay contributed from each delay circuit 101(1)-101(8) has to be equal to $T_{period}$ ($t_1+t_2+t_3+..+t_8=T_{period}$). The control signal used for achieving this locking condition, i.e. $V_{control}$, is generated by a phase detector 102, a charge pump 103, and a loop filter (e.g. capacitor) 105, and is provided to delay cells 110(1)-110(8) via a feedback loop 106.

Specifically, phase detector 102 can compare the phase of external clock CLK on line 107 to the output of delay cell 110(8), i.e. clock CK8. If the phase of clock CK8 is slightly ahead or behind the phase of external clock CLK, then phase detector 102 can generate an appropriate signal to charge pump 103. Charge pump 103, in turn, can generate an appropriate control voltage $V_{control}$, which is then provided to delay adjustment circuits 104(1)-104(8) via feedback loop 106. Capacitor 105 determines the time constant of how fast the correction can be made in DLL 100 (i.e. its bandwidth). Specifically, capacitor 105 determines the rate that the control voltage $V_{control}$ can be updated, wherein the smaller the capacitor the higher the bandwidth and the faster the error correction. In one embodiment, delay adjustment circuits 104(1)-104(8) can include voltage controlled current sources.

The optimal adjustment of delay adjustment circuits 104(1)-104(8) results in external clock CLK and clock CK8 having the same phase. Note that other clocks, i.e. CK1-CK7, could still exhibit some duty cycle offset, which can undesirably result in slightly indeterminate phases if delay circuits 101(1)-101(8) are not identical due to the silicon manufacturing process. Referring back to FIG. 2, clocks CK1-CK8 are each shown as having a duty cycle of 50%. That is, each clock is "on" for the same time that the clock is "off". For example, CK3 is on during times t4-t7 and off during times t8-t11.

Notably, there are no constraints on the duty cycle of individual clocks in a conventional DLL. Unfortunately, if a duty cycle offset exists in one delay cell, it can induce mismatch and duty offset to other phases of subsequent clocks. FIG. 4 illustrates a phase distribution chart 400 including the rising and falling edges of clocks CL1-CK8 with one duty cycle offset that induces other duty cycle offsets.

Specifically, phase distribution chart 400 includes a duty cycle offset in falling clock edge 3'. Thus, the summation of vectors 3 and 3' creates an offset vector 3off, which includes offset vector components 3off_x and 3off_y. These offset vector components adversely affect the nearest, subsequent vectors. Namely, vector component 3off_x is added to vector 4 whereas offset vector component 3off_y is added to vector 6. The resulting vectors 4 and 6 (shown by dashed lines) now also have duty cycle offsets, which were induced by offset vector 3off. These duty cycle offsets will in turn propagate to other clock phases (and so on) until an equilibrium condition is reached by feedback loop 106 of DLL 100. Thus, the uniformity of clock phases and the duty cycle of clocks from DLL 100 cannot be guaranteed.

Duty cycle correcting techniques are currently implemented after the multiphase clocks have been generated. For example, U.S. Pat. No. 6,897,693 (Kim) teaches one such technique. However, in Kim, the relationship between multiphase clocks generated by a DLL cannot be maintained. Specifically, because of the possible delay mismatch between duty correctors, the phase relationships between the generated clocks cannot be guaranteed. Kim also teaches applying duty cycle correction to an input amplifier that receives the external clock (i.e. before the DLL). However, this technique cannot ensure the duty cycles of the multiphase clocks because duty cycle offsets occur within the DLL.

Notably, in many new applications, the technology trend of higher frequency and faster data processing rate result in using both rising and falling edges of clock. Furthermore, many systems now operate with multiple clock phases. These factors impose strict requirements on the duty cycle of clocks. A DLL operating with 50% duty clocks supports a wider timing margin and hence better system performance.

Therefore, a need arises for a DLL that can provide both an accurate relationship between multiphase clocks and a duty cycle of 50% for each clock.

SUMMARY OF THE INVENTION

A delay-locked loop (DLL) can advantageously employ an in-loop duty cycle corrector (DCC) to provide accurate multiphase clock generation with 50% duty cycle. As described herein, each delay cell can advantageously provide both delay and duty cycle correction functionality.

Specifically, a delay-locked loop (DLL) can include a plurality of serially-connected delay cells, wherein each delay cell includes an internal duty cycle correction loop. Delay correction circuitry can provide a control voltage to the plurality of delay cells via a feedback loop. A lock detector can activate the duty cycle correction loop of each delay cell based on the control voltage.

Each delay cell can include a delay circuit, a delay adjustment circuit, a duty cycle corrector, and a duty cycle adjustment circuit. The delay circuit can receive an input clock signal and generate an output clock signal. The delay adjustment circuit can receive a signal on the DLL feedback loop and delay the input clock signal. The duty cycle corrector can receive the output clock signal and generate an offset signal. The duty cycle adjustment circuit can receive the offset signal and modify the output clock signal. Note that a conventional delay cell would only include a delay circuit and a delay adjustment circuit.

In one embodiment, the delay circuit and the delay adjustment circuit can be implemented using a first transconductor, the duty cycle corrector can be implemented using a second transconductor, and the duty cycle adjustment circuit can be implemented using a third transconductor. In one embodiment, the first, second, and third transconductors are fully differential. In another embodiment, the first transconductor is fully differential, the second transconductor is differential input and single-ended output, and the third transconductor is single input and differential output.

The delay correction circuitry can include a first capacitor to determine a first bandwidth of the DLL feedback loop. Each delay cell can include a second capacitor to determine a second bandwidth of the duty cycle correction loop. In one embodiment, the second bandwidth is at least 10× (i.e. one decade from) the first bandwidth to achieve fast and stable operation. The second capacitor can advantageously provide a dominant pole in the duty cycle correction loop.

In one embodiment, the first transconductor can receive a signal on the feedback loop and modify a delay of the input clock signal. The output clock signal is based on an output of the first transconductor. The second transconductor can receive the output clock signal and sense a duty cycle offset in the output clock signal. The third transconductor can receive a voltage offset signal corresponding to the duty cycle offset and modify the output of the first transconductor until a duty cycle of the output clock signal is 50%.

A delay cell for a delay-locked loop (DLL) is also described. This delay cell can include a first transconductor and a duty cycle correction circuit. The first transconductor can delay an input signal to the delay cell based on a feedback loop of the DLL. The duty cycle correction circuit can modify a duty cycle of an output signal of the delay cell based on an internal loop of the delay cell. This duty cycle correction circuit can include a second transconductor, a capacitor, and a third transconductor.

The second transconductor can receive an output clock of the delay cell. The capacitor is connected to an output of the second transconductor. Due to the periodicity of a clock signal, the integration of a clock signal over time can advantageously generate an average voltage that indicates if there is any duty cycle offset from an ideal value of 50%. In this embodiment, the capacitor can generate this timeaveraged voltage. The third transconductor receives this integrated value and generates a corresponding offset current. Notably, the output clock of the delay cell can be formed using either the output of the first transconductor signal or the combined outputs of the first and third transconductors. For example, the output of the first transconductor can form the output signal of the delay cell during an inactive duty cycle correction (DCC) state of the delay cell, and the combined outputs of the first and third transconductors can form the output signal of the delay cell during an active DCC state of the delay cell. In one embodiment, the inactive DCC state can precede the active DCC state.

A method of generating multiple phases of a clock in a delay-locked loop (DLL) is also described. In this method, a plurality of delay cells can be used to delay a clock received by the DLL. Each delay cell can output one phase of the clock. Delay correction can be performed using a DLL feedback loop, wherein the DLL feedback loop can be connected to each delay cell. Duty cycle correction can be advantageously performed within each delay cell of the DLL, thereby minimizing duty cycle offset propagation in the DLL. In one embodiment, performing the delay correction can precede performing the duty cycle correction. The duty cycle correction can continue until a 50% duty cycle is reached.

DETAILED DESCRIPTION OF THE FIGURES

Current applications run at ever increasing speeds to provide more functionality. These speeds in turn require many components in an IC to be carefully timed such that they can be turned on or off precisely at different (or same) instants of time. To ensure this timing, a delay-locked loop (DLL) can be used to generate a plurality of internal clocks that are synchronized with an external clock. The better the quality of those internal clocks, i.e. the better they are synchronized, the higher the performance of the system.

Optimally, each delay cell of a DLL would be identical, thereby ensuring an accurate relationship between multiphase clocks. Unfortunately, commercial manufacturing processes can result in slight variations in delay cells. Even slight variations between delay cells can cause undesirable delay cycle offsets, thereby skewing one or more clocks generated by the DLL. In accordance with one aspect of the invention, each delay cell can provide its own internal duty cycle correction, thereby ensuring an accurate relationship between the generated multiphase clocks as well as providing a 50% duty cycle for each clock. In other words, this improved delay cell can advantageously preserve both clock phase and optimal duty cycle simultaneously.

Figure 5:
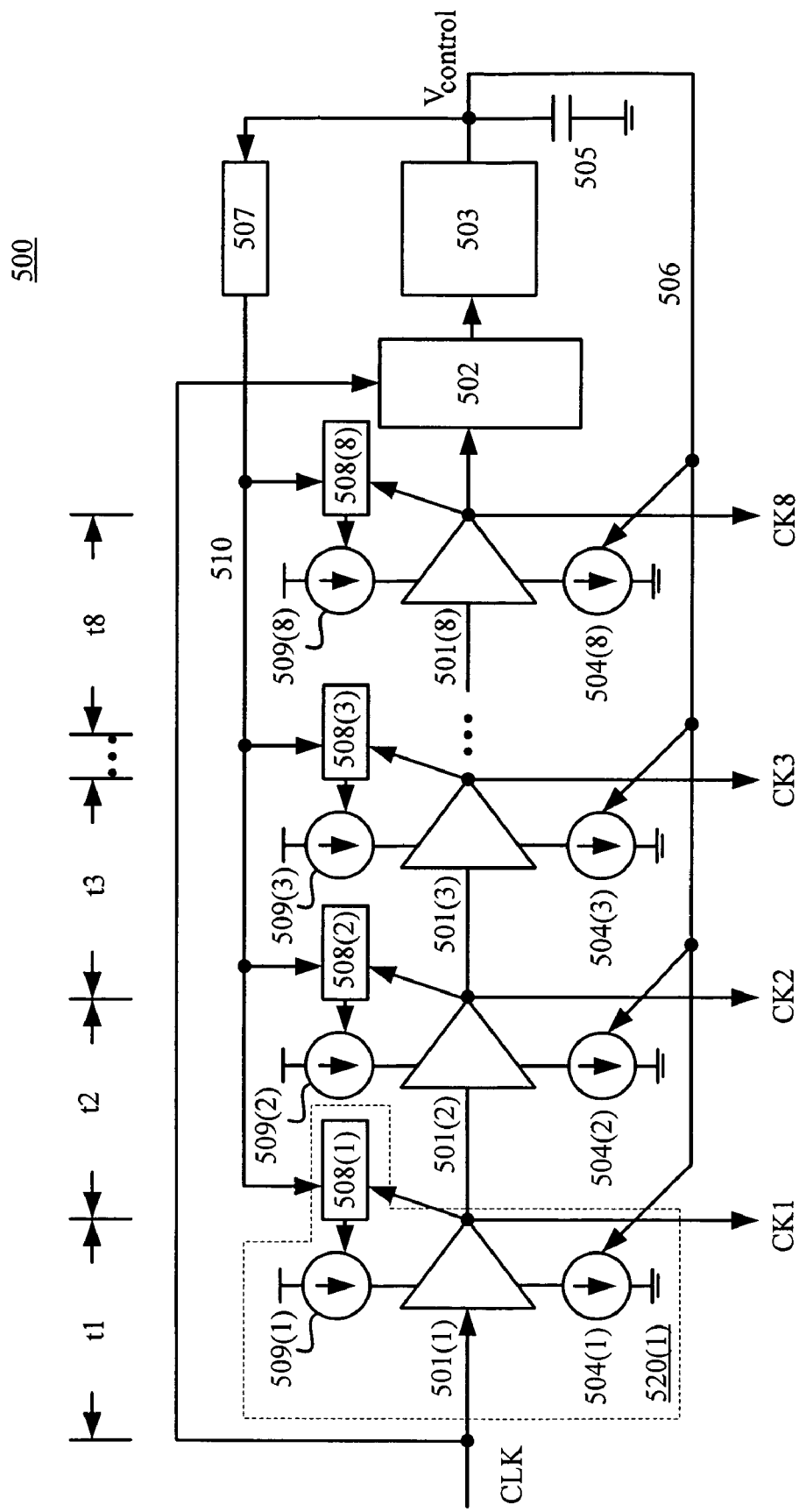
FIG. 5 illustrates a DLL that can provide internal duty cycle correction for each delay cell, thereby ensuring an accurate multiphase clock relationship as well as a 50% duty cycle.

FIG. 5 illustrates an exemplary DLL 500 in accordance with the present invention that can receive an external clock CLK and generate a plurality of internal clocks that are accurately synchronized with external clock CLK. In this embodiment, DLL 500 includes eight serially-connected delay cells 520(1)-520(8), wherein each delay cell includes a delay circuit 501, a delay adjustment circuit 504, a duty cycle corrector 508, and a duty cycle adjustment circuit 509. For example, delay cell 520(1) includes a delay circuit 501(1), a delay adjustment circuit 504(1), a duty cycle corrector 508(1), and a duty cycle adjustment circuit 509(1). The other delay cells in DLL 500, i.e. delay cells 520(2)-520(8), can be formed using similar components.

In this embodiment, delay cells 520(1)-520(8) can generate clocks CK1-CK8, respectively. When DLL 500 is in an ideal locking condition, the generated clocks, e.g. CK1-CK8, are distributed uniformly in one period of a clock cycle ($T_{period}$). The control voltage for achieving this locking condition, i.e. $V_{control}$, can be generated by a phase detector 502, a charge pump 503, and a loop filter (e.g. capacitor) 505 (collectively called delay correction circuitry). The control voltage $V_{control}$ can be provided to delay cells 520(1)-520(8) via a feedback loop 506.

Specifically, a phase detector 502 can compare the phase of external clock CLK to the output of delay circuit 501(8), i.e. clock CK8. If the phase of clock CK8 is slightly ahead or behind the phase of external clock CLK, then phase detector 502 can generate an appropriate signal to charge pump 503. Charge pump 503, in turn, can generate the appropriate control voltage $V_{control}$, which is then provided to delay adjustment circuits 504(1)-504(8) via feedback loop 506. Capacitor 505 determines the bandwidth of DLL 500.

In one embodiment, DLL 500 can first lock to external clock CLK using delay adjustment circuits 504(1)-504(8) without duty cycle correction, i.e. without activating duty cycle correctors 508(1)-508(8) and duty cycle adjustment circuits 509(1)-509(8) (called in inactive DCC state). Then, when lock detector 507 determines that the control voltage $V_{control}$ is within a specified range (e.g. within 20% of the final target value of $V_{control}$), duty cycle correctors 508(1)-508(8) and duty cycle adjustment circuits 509(1)-509(8) can be activated (called an active DCC state).

Figure 6:
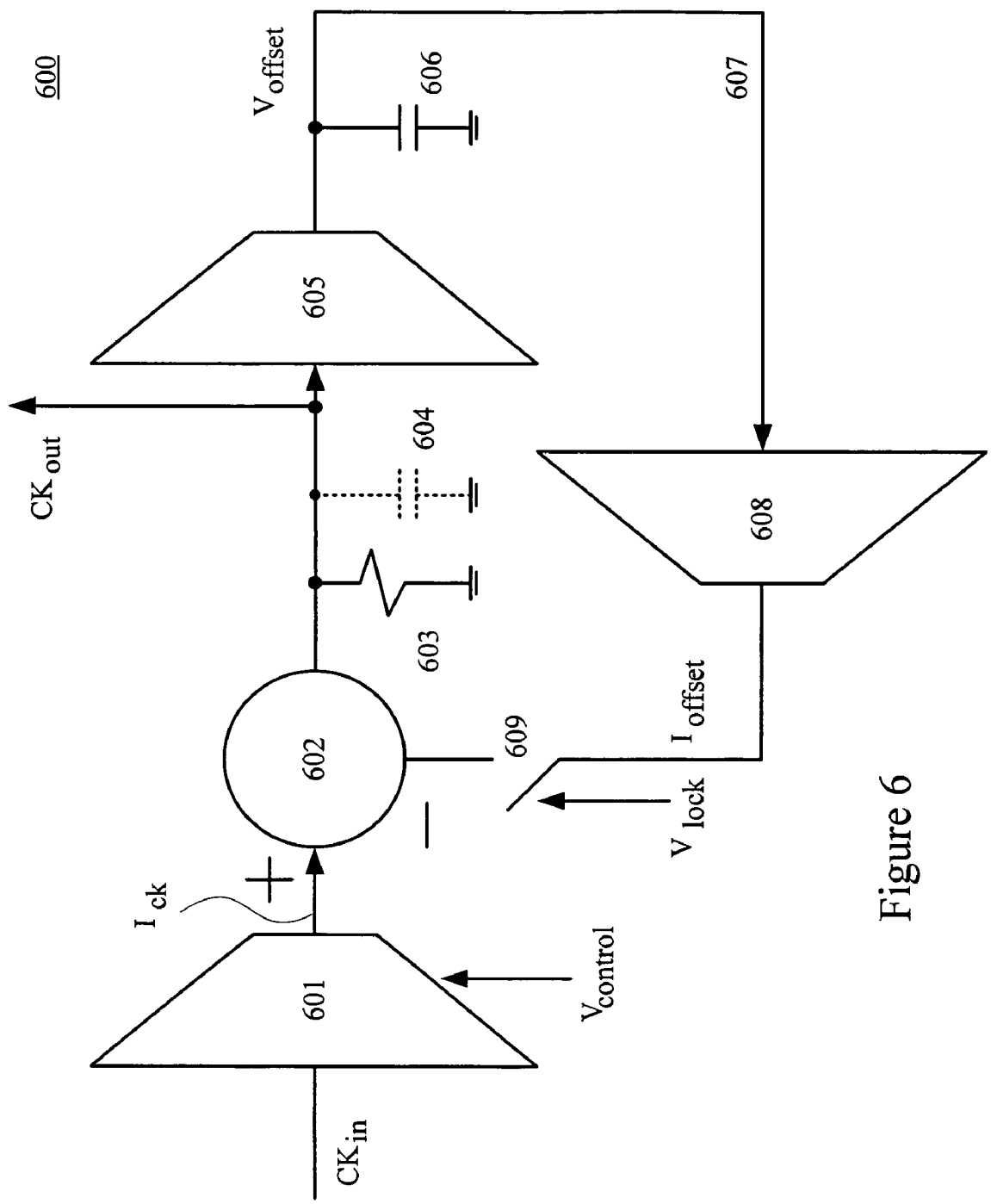
FIG. 6 illustrates an exemplary delay cell in the DLL of FIG. 5.

FIG. 6 illustrates a block diagram of an exemplary implementation for a delay cell 600 that can advantageously provide an accurate clock as well as duty cycle correction. Specifically, delay cell 600 can include a summation circuit 602, a resistor 603, a parasitic capacitor 604, a capacitor 606, a switch 609, and three transconductors 601, 605, and 608, wherein each transconductor can receive an input voltage and convert that input voltage to an output current.

For example, transconductor 601 receives an input clock $CK_{in}$. The control voltage $V_{control}$, i.e. the feedback signal provided on feedback loop 506, can adjust the delay of input clock $CK_{in}$. Based on this adjustment, transconductor 601 then outputs a corresponding clock current $I_{ck}$.

Resistor 603 can convert the clock current generated by summation circuit 602 into an output clock $CK_{out}$. Transconductor 605 can sense the duty cycle offset in output clock $CK_{out}$. Note that due to the periodicity of a clock signal, the integration of a clock signal over time can advantageously generate an average voltage that indicates if there is any duty cycle offset from an ideal value of 50%. In this embodiment, capacitor 606 can generate this time-averaged voltage $V_{offset}$. Based on $V_{offset}$, transconductor 608 can generate a proportional offset current $I_{offset}$. If switch 609 is closed (as determined by voltage lock signal $V_{lock}$), then summation circuit 602 can subtract that current offset $I_{offset}$ from a clock current $I_{ck}$ to balance the duty cycle of the input clock $CK_{in}$.

Note that parasitic capacitor 604 takes into account the loading of parasitic capacitance and the input loading of transconductor 605. In contrast, capacitor 606 can be advantageously sized to create a dominant pole in the duty cycle correction loop. That is, positioning two poles of relatively the same strength too close could create an undesirable oscillation. In delay cell 600, transconductor 605 separates two poles that are widely different in strength (capacitor 606 being much larger than parasitic capacitor 604). Therefore, no oscillation occurs in delay cell 600. Moreover, because capacitor 606 generates a pole that is clearly dominant over the pole generated by resistor 603 and parasitic capacitor 604, the duty cycle correction loop is stable.

Note that the charging rate to capacitor 606 effectively determines the bandwidth of the duty cycle correction loop. In accordance with one embodiment, the bandwidths of the duty cycle correction loop and the delay-locked loop can differ by a factor of 10 (i.e. by a decade). To provide this bandwidth differential, capacitor 606 can be made relatively small compared to capacitor 505 (FIG. 5). This bandwidth differential can advantageously ensure fast duty cycle correction, thereby making the duty cycle correction essentially transparent to the locking of the external clock. Moreover, note that the duty cycle correction loop minimally overlaps with the delay-locked loop, thereby ensuring these loops do not conflict with one another. Hence, the operation of each delay cell is stable both in reference to the duty cycle correction loop as well as the delay-locked loop.

Figure 7A:
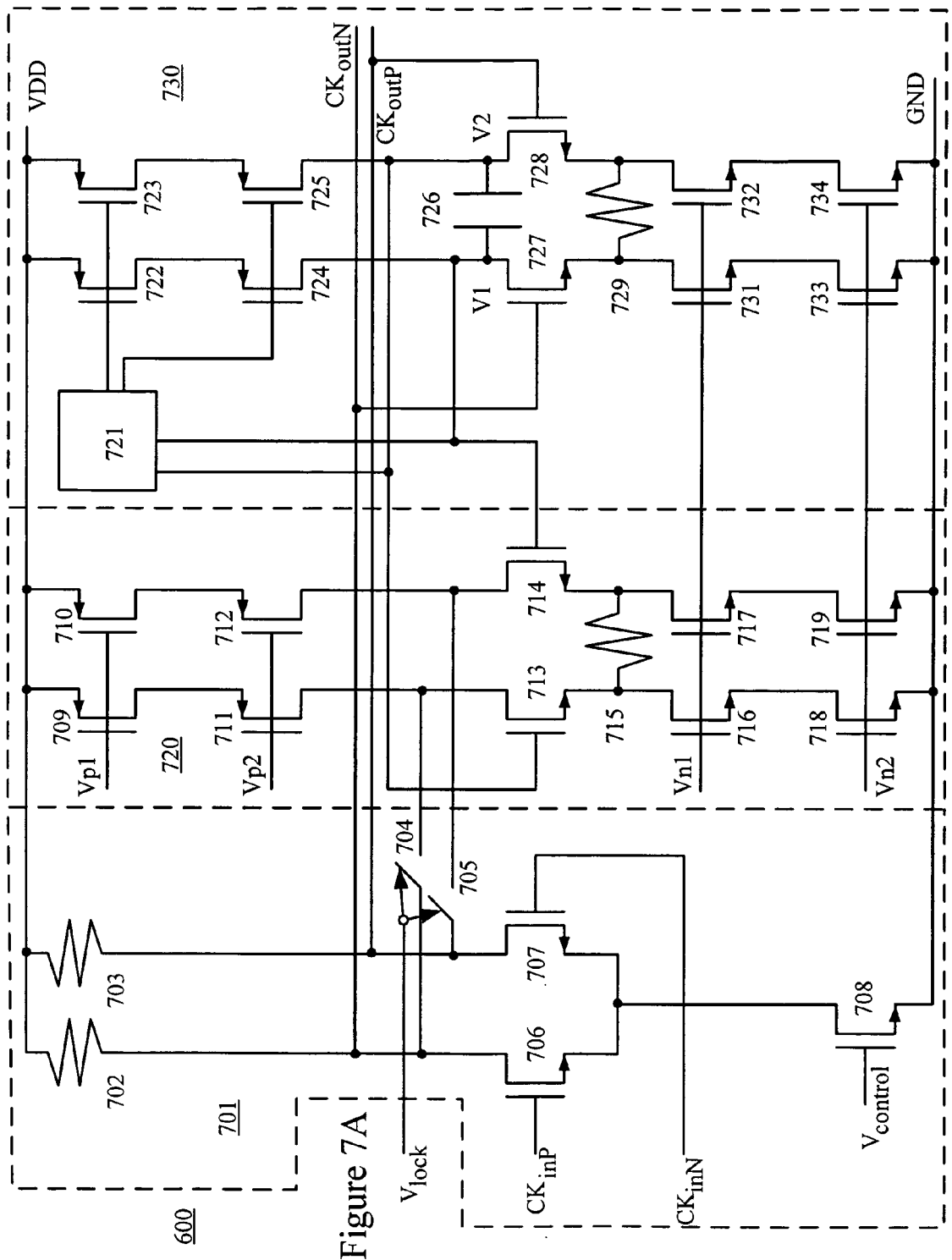
FIG. 7A illustrates an exemplary transistor-level implementation of the delay cell of FIG. 6.

FIG. 7A illustrates one embodiment of delay cell 600. In this embodiment, a delay cell sub-circuit 701 can implement transconductor 601, summation circuit 602, and resistor 603. Delay cell sub-circuit 701 includes two NMOS transistors 706 and 707 that respectively receive input clock signals $CK_{inP}$ and $CK_{inN}$, i.e. a differential clock signal, on their gates. An NMOS transistor 708 receives the control voltage $V_{control}$ on its gate. NMOS transistor 708 has its source connected to a first voltage source GND and its drain connected to the sources of NMOS transistors 706 and 707. The drains of NMOS transistors 706 and 707 are connected to a second voltage source VDD via resistors 702 and 703, respectively. In one embodiment, resistors 702 and 703 can be implemented with PMOS transistors controlled by a biasing circuit. (Note that parasitic capacitance 604 in FIG. 6 is an inherent result of manufacturing and is not a device per se. Therefore, although mathematically present, the parasitic capacitance associated with a delay cell is not shown in FIGS. 7A and 7B.) In this configuration, delay cell sub-circuit 701 implements transconductor 601 as a resistor-load buffer having a delay tunable by its tail current.

Notably, the drains of NMOS transistors 706 and 707 are also connected to switches 704 and 705, respectively. Switches 704 and 705 are controlled by a voltage lock signal $V_{lock}$. When switches 704 and 705 are closed, the duty cycle correction functionality for delay cell 600 is activated. As described above, in accordance with one aspect of the invention, this duty correction functionality is activated only after the delay-lock loop has locked to the external clock. Thus, the voltage lock signal $V_{lock}$ is the output of lock detector 507 (FIG. 5) and switches 704 and 705 implement switch 609 (FIG. 6). When switches 704 and 705 are closed, then the duty cycle loop is effectively connected to transconductor 601 and summation circuit 602. Note that the drains of NMOS transistors 706 and 707 can advantageously model summation circuit 602. Furthermore, the drains of NMOS transistors 706 and 707 are connected to the output clock terminals $CK_{outN}$ and $CK_{outP}$, respectively.

In this embodiment of delay cell 600, delay cell sub-circuit 720 can implement transconductor 608. Delay cell sub-circuit 720 includes two NMOS transistors 718 and 716 connected in series between voltage source GND and a first junction of a resistor 715. Two NMOS transistors 719 and 717 are also connected in series between voltage source GND and a second junction of resistor 715. The gates of NMOS transistors 716 and 717 receive a bias voltage Vn1, whereas the gates of NMOS transistors 718 and 719 receives a bias voltage Vn2. In this configuration, NMOS transistors 716 and 718 provide one fixed current source connected to voltage source GND whereas NMOS transistors 717 and 719 provide another fixed current source connected to voltage source GND.

Delay cell sub-circuit 720 can further include two NMOS transistors 713 and 714 having sources connected to the first and second junctions of resistor 715. The drains of NMOS transistors 713 and 714 are connectable to switches 704 and 705, respectively. The gates of NMOS transistors 713 and 714 are connected to a delay sub-circuit 730, described in further detail below.

In delay cell sub-circuit 720, two PMOS transistors 709 and 711 are connected in series between voltage source VDD and the drain of NMOS transistor 713. Two PMOS transistors 710 and 712 are also connected in series between voltage source VDD and the drain of NMOS transistor 714. The gates of PMOS transistors 709 and 710 receive a bias voltage Vp1, whereas the gates of PMOS transistors 711 and 712 receive a bias voltage Vp2. In this configuration, PMOS transistors 709 and 711 provide one fixed current source connected to voltage source VDD whereas PMOS transistors 710 and 712 provide another fixed current source connected to voltage source VDD.

In this embodiment using resistor 715 (which is positioned at the sources of the input to the transconductor and reduces the gain), transconductor 608 is implemented as a source-degenerated transconductor, which advantageously provides a wide linear operating range. Delay cell sub-circuit 720 provides the high output impedance associated with transconductor 608 by using the above-described cascaded current source load. The delta current of transconductor 608 can be computed by multiplying the gain (Gm) of transconductor 608 by the voltage offset as provided at the gates of NMOS transistors 713 and 714 ($\Delta I = Gm \times V_{offset}$).

In this embodiment of delay cell 600, delay cell sub-circuit 730 can implement transconductor 605. Delay cell sub-circuit 730 includes two NMOS transistors 733 and 731 connected in series between voltage source GND and a first junction of a resistor 729. Two NMOS transistors 734 and 732 are also connected in series between voltage source GND and a second junction of resistor 729. The gates of NMOS transistors 731 and 732 receive the bias voltage Vn1, whereas the gates of NMOS transistors 733 and 734 receives the bias voltage Vn2. In this configuration, NMOS transistors 731 and 733 provide one fixed current source connected to voltage source GND whereas NMOS transistors 732 and 734 provide another fixed current source connected to voltage source GND.

Delay cell sub-circuit 730 can further include two NMOS transistors 727 and 728 having sources connected to the first and second junctions of resistor 729. The drains of NMOS transistors 727 and 728 are connectable to first and second junctions of a capacitor 726, which can implement sensing capacitor 606 (FIG. 6). The gates of NMOS transistors 727 and 728 are connected to the clock output terminals $CK_{outN}$ and $CK_{outP}$, respectively.

In delay cell sub-circuit 730, two PMOS transistors 722 and 724 are connected in series between voltage source VDD and the drain of NMOS transistor 727. Two PMOS transistors 723 and 725 are also connected in series between voltage source VDD and the drain of NMOS transistor 728. The gates of PMOS transistors 722 and 723 receive a first voltage from a common mode feedback block (CMFB) 721, whereas the gates of PMOS transistors 724 and 725 receive a second voltage from CMFB 721. In this configuration, PMOS transistors 722 and 724 provide one fixed current source connected to voltage source VDD whereas PMOS transistors 723 and 725 provide another fixed current source connected to voltage source VDD.

Notably, CMFB 721 can sense the output of delay cell sub-circuit 730, i.e. the output of transconductor 605, as provided at the first and second junctions of capacitor 726. (This output is also provided to the gates of transistors 713 and 714, i.e. the input of delay cell sub-circuit 720, i.e. the input of transconductor 608.) In response to that output, CMFB 721 can continuously adjust the bias voltages provided to PMOS transistors 722-725 to stabilize and define the voltages across capacitor 726 (i.e. (V1+V2)/2=common mode voltage, wherein the common mode can be set by the designer of the DLL). Thus, CMFB 721 can provide the common mode feedback for transconductor 605. A common mode feedback is advantageous to ensure that the input to transconductor 608 (as implemented by delay cell sub-circuit 720) are neither too high nor too low, thereby optimizing performance of transconductor 608.

In this embodiment using resistor 729 (which is positioned at the sources of the input to the transconductor and reduces the gain), transconductor 605 is also implemented as a source-degenerated transconductor, which advantageously provides a wide linear operating range. Delay cell sub-circuit 730 also provides the high output impedance associated with transconductor 605 by using the above-described cascaded current source load. The delta current of transconductor 605 can be computed by multiplying the gain (Gm) of transconductor 605 by the voltage offset as provided at the gates of NMOS transistors 727 and 728 ($\Delta I = Gm \times V_{offset}$).

Figure 7B:
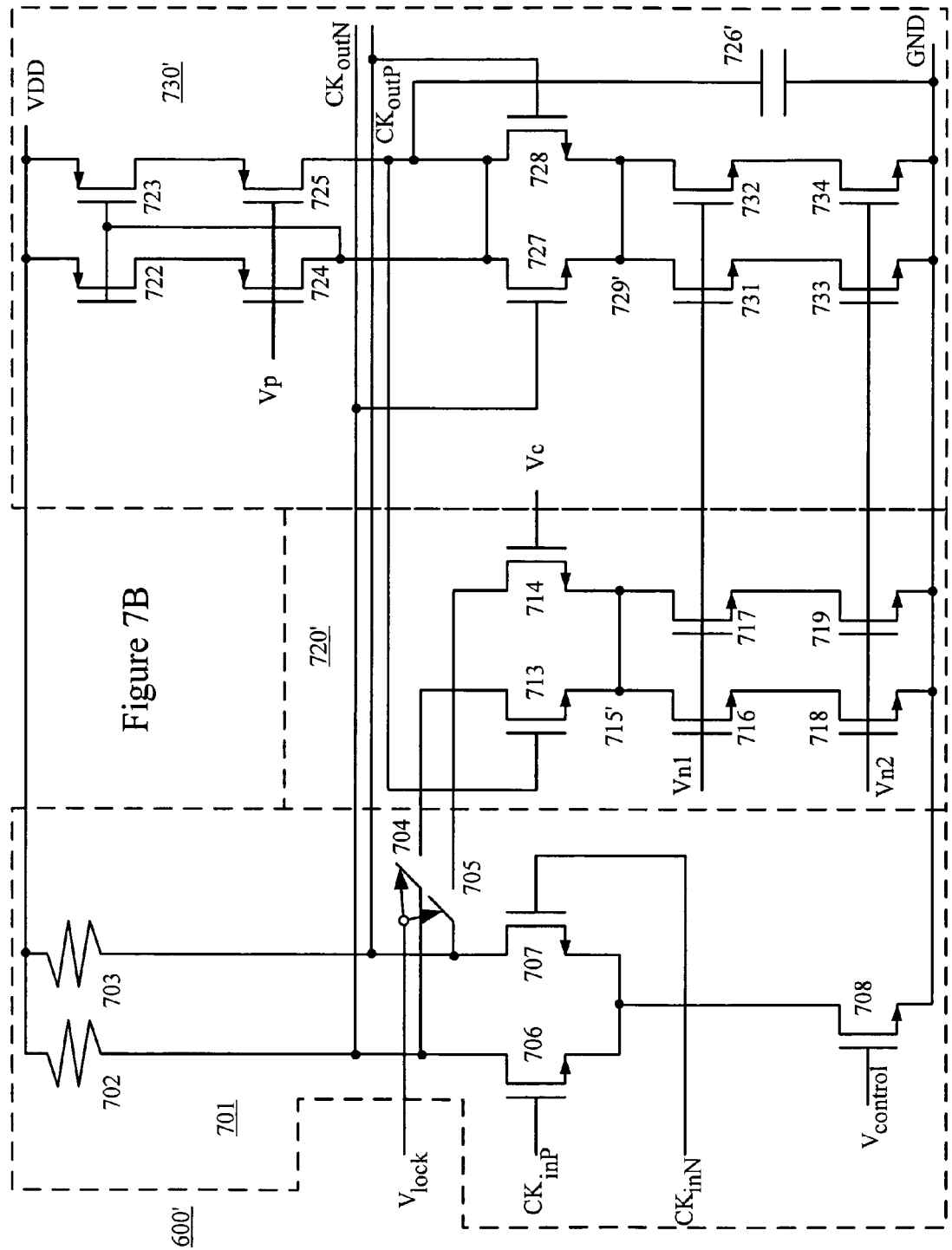
FIG. 7B illustrates another exemplary transistor-level implementation of the delay cell of FIG. 6.

FIG. 7B illustrates another embodiment of a delay cell 600'. In this embodiment, delay cell 600' can include delay cell sub-circuits 701, 720', and 730'. As described above, delay cell sub-circuit 701 can implement transconductor 601, summation circuit 602, and resistor 603. Delay cell sub-circuit 701 is configured and functions as described in reference to FIG. 7A. Delay cell sub-circuit 720' can implement transconductor 608. Delay cell sub-circuit 720' is similarly configured as delay cell sub-circuit 720 (FIG. 7A) with the following exceptions. Specifically, delay cell sub-circuit 720' eliminates PMOS transistors 709–712. Moreover, the gate of NMOS transistor 714, instead of being connected to an input terminal of CMFB 721, merely receives a bias voltage Vc. In this configuration, delay cell sub-circuit 720' implements a single-end input and differential output transconductor 608.

Delay cell sub-circuit 730' can implement transconductor 605. Delay cell sub-circuit 730' is similarly configured as delay cell sub-circuit 730 (FIG. 7A) with the following exceptions. Specifically, delay cell sub-circuit 730' reduces the resistance of resistors 715 and 729 (FIG. 7A), thereby forming lines 715' and 729', and eliminates capacitor 726 and CMFB 721. Note that because transconductor 605 is implemented as a differential to single-end device, common-mode feedback is not required. Therefore, delay cell sub-circuit 730' can be implemented as a simple differential pair. In this embodiment, the gates of PMOS transistors 722 and 723 are connected to the drain of PMOS transistor 724, whereas the gates of PMOS transistors 724 and 725 can receive bias voltage Vp. Delay cell sub-circuit 730' can also include a capacitor 726', which is connected between the drain of NMOS transistor 728 and the voltage source GND. Note that capacitor 726' is similar to capacitor 726 (FIG. 7A), but is connected between the drain of NMOS transistor 728 and the voltage source GND because transconductor 605 (implemented by duty cycle sub-circuit 730') provides a single output (i.e. at the drain of NMOS transistor 728) instead of a differential output.

Note that the gain of delay cell 600 (FIG. 7A) is essentially double that of delay cell 600' (FIG. 7B) assuming identical device sizes. However, by modifying a fully differential transconductor to a differential to single-ended transconductor, the common mode feedback circuitry can be eliminated. Thus, delay cell 600' is significantly simpler than delay cell 600. Therefore, the decision to use delay cell 600 or delay cell 600' is a tradeoff between gain requirements and complexity, which may differ between DLL designs.

Figure 8:
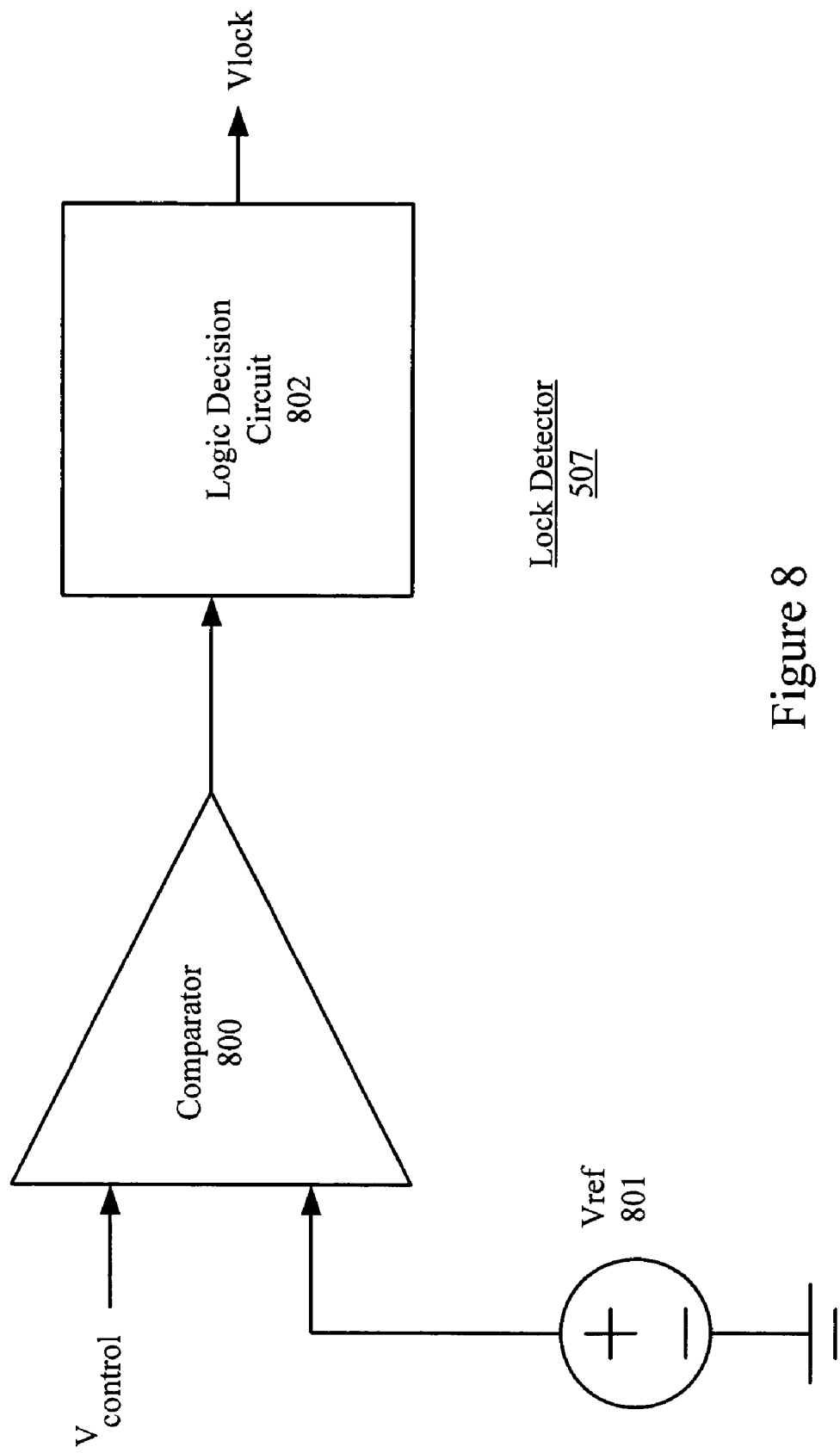
FIG. 8 illustrates a block diagram of an exemplary lock detector for the DLL.

FIG. 8 illustrates an exemplary lock detector 507. In this embodiment, the locking state of a delay-locked loop (DLL) can be determined by comparator 800. Specifically, comparator 800 can compare the control voltage $V_{control}$ with a predefined reference voltage Vref 801. Based on the output of comparator 800, a logic decision circuit 802 can then determine whether locking is appropriate and generate $V_{lock}$ to activate duty cycle correction. Note that the transition of $V_{lock}$ provides a time reference point to start DCC inner loop operation. In one embodiment, control voltage $V_{control}$ is initially low during a power-on state of the DLL, but transitions high to a certain voltage level after the DLL locks.

Notably, after the control voltage $V_{control}$ transitions high, logic decision circuit 802 can thereafter ignore further output from comparator 800. Logic decision circuit 802 can be implemented using one or more logic gates (e.g. NOR, NAND, etc) or using other conventional methods/devices. Note that the value of delay-locked voltage $V_{control}$ with and without duty cycle correction may be different. Hence, the purpose of logic decision circuit 802 is to avoid possible toggling of the control voltage $V_{control}$.

Figure 1:
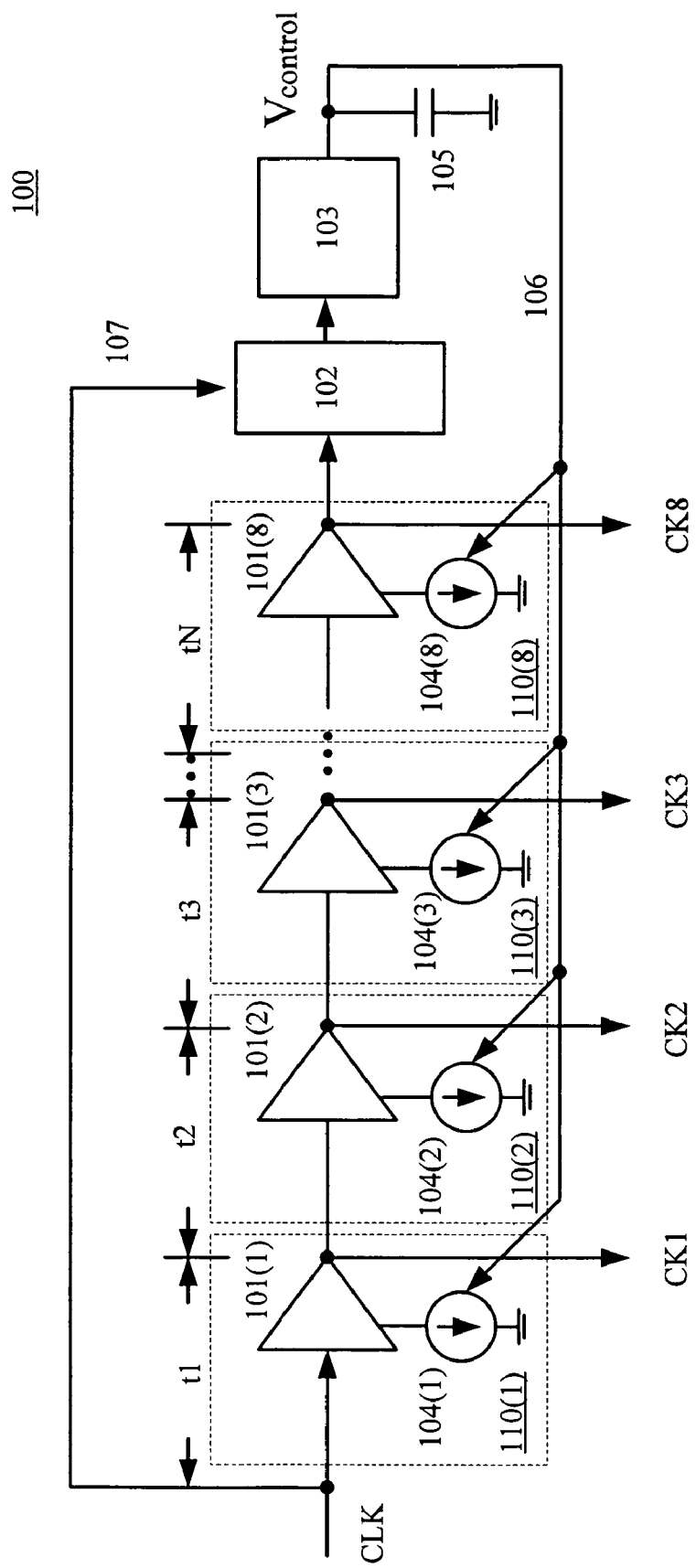
FIG. 1 illustrates a conventional delay-locked loop (DLL) that attempts to synchronize multiphase clocks using a feedback path.
Figure 2:
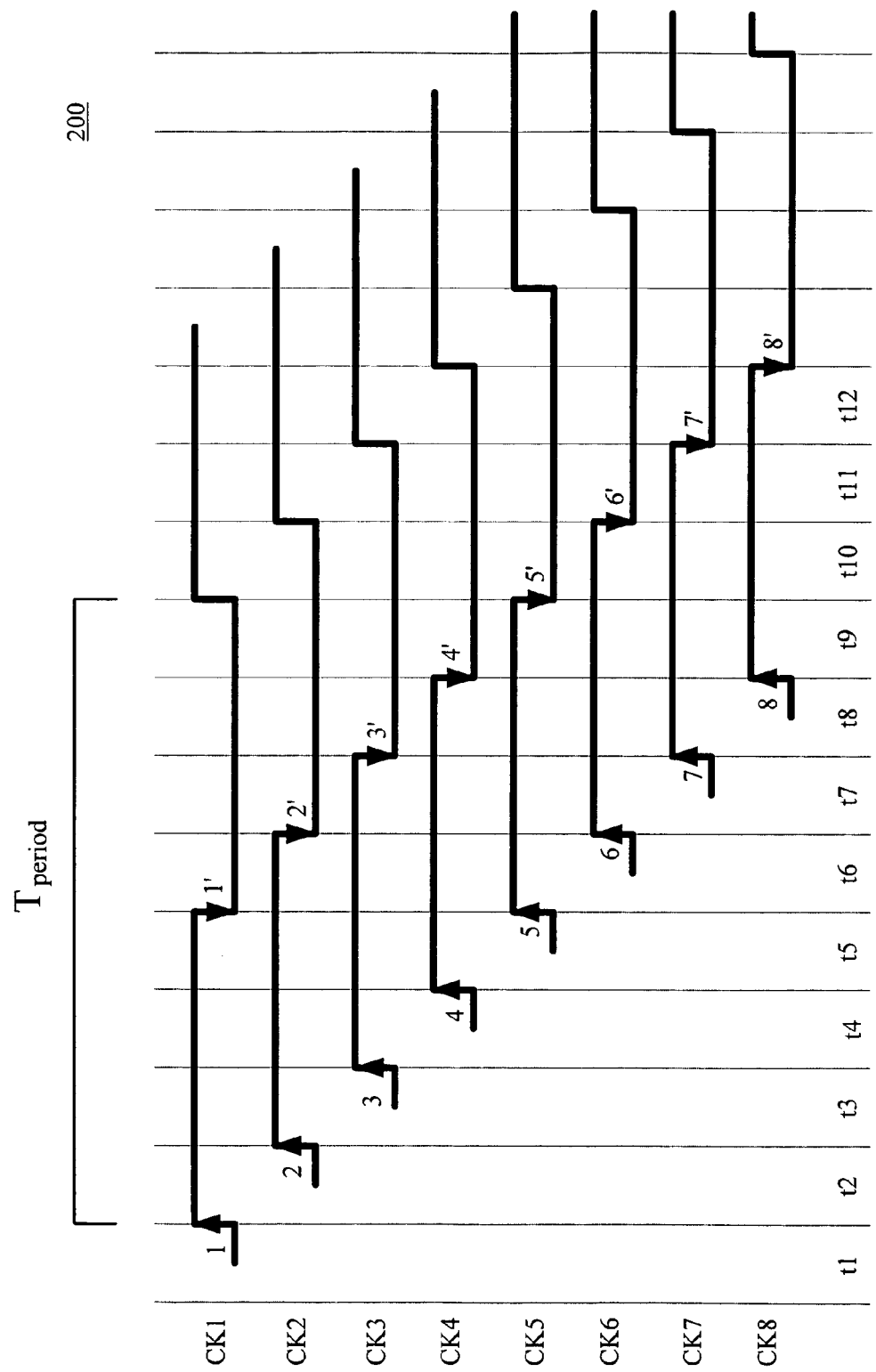
FIG. 2 illustrates a timing chart for a DLL assuming eight identical delay cells.
Figure 3:
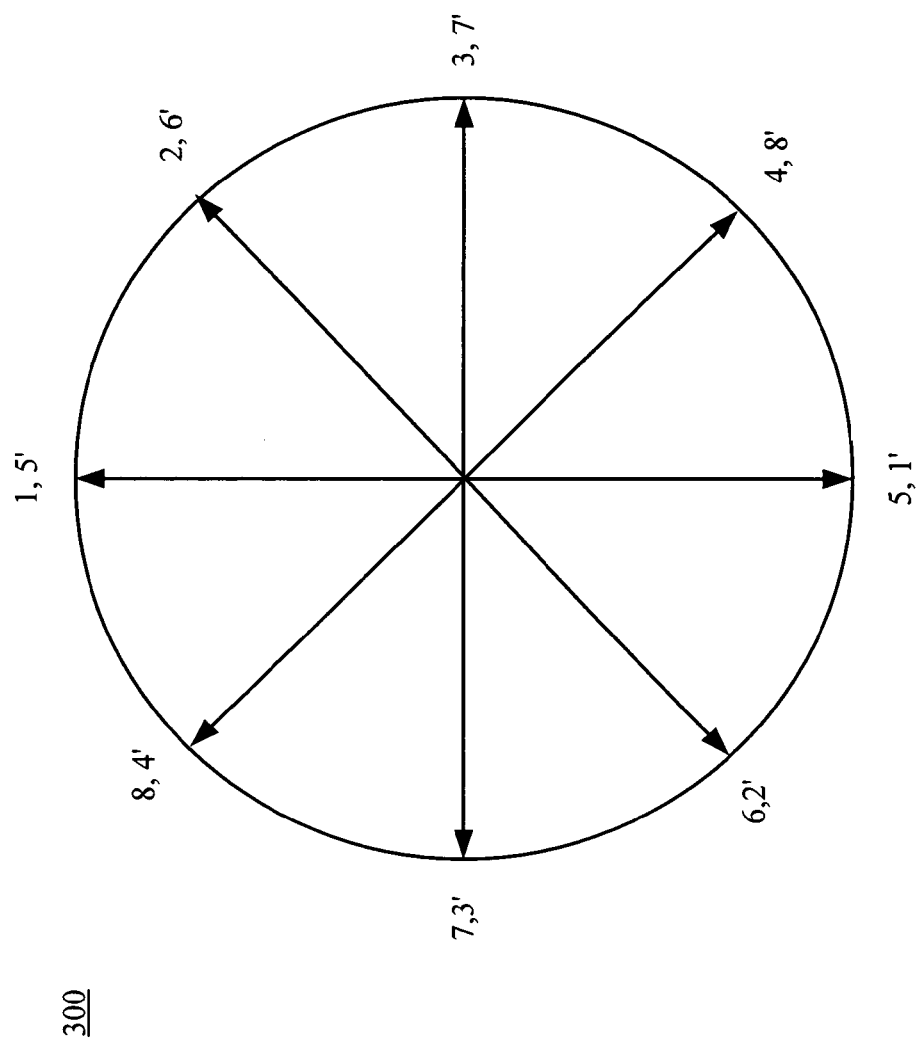
FIG. 3 illustrates a phase distribution chart corresponding to the timing chart of FIG. 2.
Figure 4:
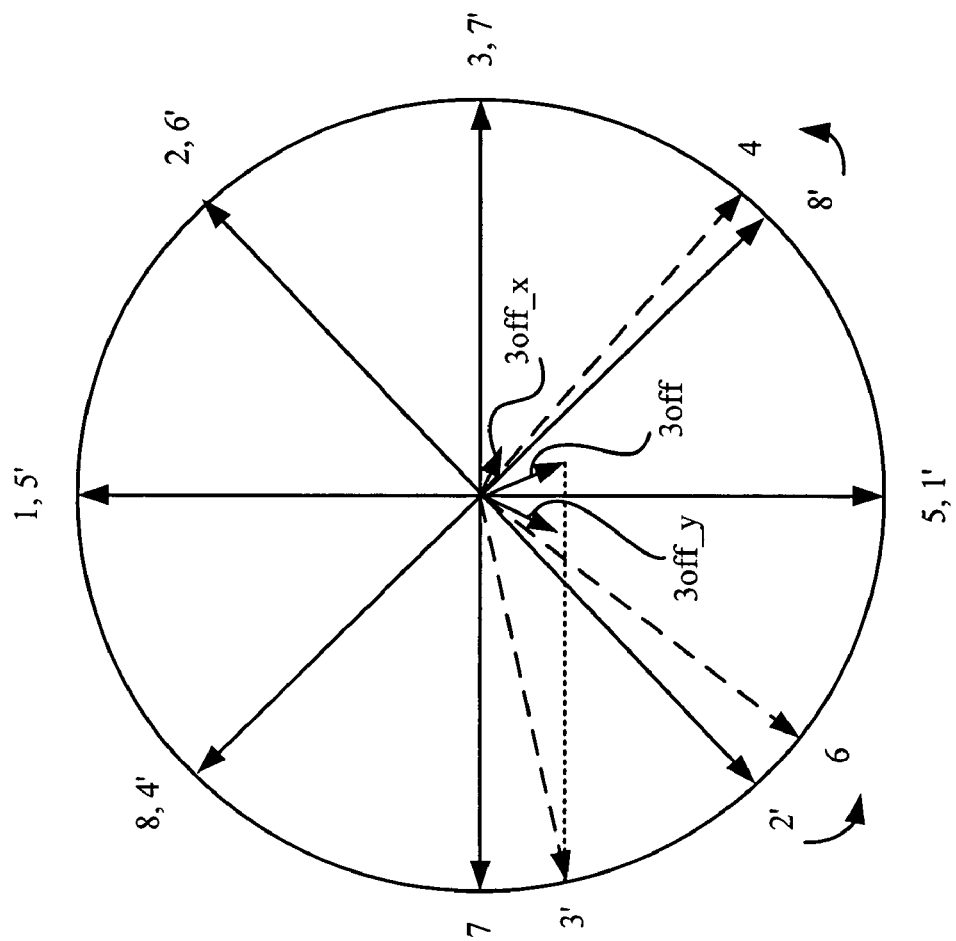
FIG. 4 illustrates a phase distribution chart assuming an initial duty cycle offset that propagates to other clocks.

As described above, a delay-locked loop (DLL) including internal duty cycle correction loops can advantageously provide an accurate relationship between its generated multiphase clocks. In accordance with one aspect of the invention, even an external clock not having a substantially 50% duty cycle can be corrected using the improved DLL. Of importance, the improved DLL is not sensitive to the duty cycle of the external clock. Because of this significant duty cycle correction capability, the number of delay cells can be reduced to half the number of standard delay cells. For example, in one embodiment, only four delay cells are provided in the DLL. In this embodiment, the output of the fourth delay cell can be inverted, thereby ensuring that its polarity matches that of the external clock (which would match that of CK8 in FIG. 2). In summary, the enhanced duty cycle correction capability of this DLL allows both rising and falling edges of the generated clocks to be used with confidence.

Although illustrative embodiments of the invention have been described in detail herein with reference to the accompanying figures, it is to be understood that the invention is not limited to those precise embodiments. They are not intended to be exhaustive or to limit the invention to the precise forms disclosed. As such, many modifications and variations will be apparent. Accordingly, it is intended that the scope of the invention be defined by the following claims and their equivalents.

The invention claimed is:

1. A delay-locked loop (DLL) including:
   a plurality of serially-connected delay cells, wherein each delay cell includes an internal duty cycle correction loop;
   delay correction circuitry for providing a control voltage to the plurality of delay cells via a DLL feedback loop; and
   a lock detector that activates the duty cycle correction loop of each delay cell based on the control voltage.

2. The DLL of claim 1, wherein each delay cell includes:
   a delay circuit for receiving an input clock signal and generating an output clock signal;
   a delay adjustment circuit for receiving a signal on the DLL feedback loop and modifying the input clock signal;
   a duty cycle corrector for receiving the output clock signal and generating an offset signal; and
   a duty cycle adjustment circuit for receiving the offset signal and modifying the output clock signal.

3. The DLL of claim 2, wherein the delay circuit and the delay adjustment circuit include a first transconductor (601), the duty cycle corrector includes a second transconductor (605), and the duty cycle adjustment circuit includes a third transconductor (608).

4. The DLL of claim 3, wherein the first, second, and third transconductors are fully differential.

5. The DLL of claim 3, wherein the first transconductor is fully differential, the second transconductor is differential input and single-ended output, and the third transconductor is single input and differential output.

6. The DLL of claim 1, wherein the delay correction circuitry includes a first capacitor to determine a first bandwidth of the DLL feedback loop, wherein the delay cell includes a second capacitor to determine a second bandwidth of the duty cycle correction loop, and the second bandwidth is at least 10× the first bandwidth.

7. The DLL of claim 1, wherein the delay cell includes a capacitor to determine a bandwidth of the duty cycle correction loop, wherein the capacitor provides a dominant pole in the duty cycle correction loop.

8. The DLL of claim 1, wherein each delay cell includes:
a first transconductor for receiving a signal on the DLL feedback loop and modifying a delay of the input clock signal, wherein an output clock signal is based on an output of the first transconductor;
a second transconductor for receiving the output clock signal and sensing a duty cycle offset in the output clock signal; and
a third transconductor for receiving a voltage offset signal corresponding to the duty cycle offset and modifying the output of the first transconductor until a duty cycle of the output clock signal is 50%.

9. The DLL of claim 8, wherein the first, second, and third transconductors are fully differential.

10. The DLL of claim 8, wherein the first transconductor is fully differential, the second transconductor is differential input and single-ended output, and the third transconductor is single input and differential output.

11. The DLL of claim 8, wherein the delay correction circuitry includes a first capacitor to determine a first bandwidth of the DLL feedback loop, wherein the delay cell includes a second capacitor to determine a second bandwidth of the duty cycle correction loop, and the second bandwidth is at least 10× the first bandwidth.

12. The DLL of claim 8, wherein the delay cell includes a capacitor to determine a bandwidth of the duty cycle correction loop, wherein the capacitor provides a dominant pole in the duty cycle correction loop.

13. A delay cell for a delay-locked loop (DLL), the delay cell including:
a first transconductor that delays an input signal to the delay cell based on a DLL feedback loop; and
a duty cycle correction circuit for modifying a duty cycle of an output signal of the delay cell based on an internal loop of the delay cell.

14. The delay cell of claim 13, wherein the duty cycle correction circuit includes:
a second transconductor coupled to an output of the first transconductor;
a capacitor connected to an output of the second transconductor; and
a third transconductor connected to the output of the second transconductor and the capacitor,
wherein an output of the first transconductor forms the output signal of the delay cell or combined outputs of the first and third transconductors form the output signal of the delay cell.

15. The delay cell of claim 14, wherein the output of the first transconductor forms the output signal of the delay cell during an inactive duty cycle correction (DCC) state of the delay cell, and wherein the combined outputs of the first and third transconductors form the output signal of the delay cell during an active DCC state of the delay cell.

16. The delay cell of claim 14, wherein the inactive DCC state precedes the active DCC state.

17. The delay cell of claim 14, wherein the first, second, and third transconductors are fully differential.

18. The delay cell of claim 8, wherein the first transconductor is fully differential, the second transconductor is differential input and single-ended output, and the third transconductor is single input and differential output.

19. The delay cell of claim 14, wherein the capacitor provides a high bandwidth compared to that of the DLL feedback loop.

20. The delay cell of claim 14, wherein the capacitor provides a dominant pole in the internal loop.

21. A method of generating multiple phases of a clock in a delay-locked loop (DLL), the method comprising:
using a plurality of delay cells to delay a clock received by the DLL, each delay cell outputting one phase of the clock;
performing delay correction using a DLL feedback loop, the DLL feedback loop connected to each delay cell; and
performing duty cycle correction by using an internal loop within each delay cell of the DLL, thereby minimizing duty cycle offset propagation in the DLL.

22. The method of claim 21, wherein performing delay correction precedes performing duty cycle correction.

23. The method of claim 21, wherein performing duty cycle correction includes providing a 50% duty cycle.

24. A method of generating multiple phases of a clock in a delay-locked loop (DLL), the method comprising:
using a plurality of delay cells to delay a clock received by the DLL, each delay cell outputting one phase of the clock;
performing delay correction using a DLL feedback loop, the DLL feedback loop connected to each delay cell; and
performing duty cycle correction within each delay cell of the DLL, thereby minimizing duty cycle offset propagation in the DLL, wherein performing duty cycle correction includes providing a 50% duty cycle, wherein the clock received by the DLL is not approximately 50% duty cycle.

* * * * *